United States Patent
Hung et al.

(10) Patent No.: US 9,685,596 B2
(45) Date of Patent: Jun. 20, 2017

(54) PACKAGE METHOD AND PACKAGE

(71) Applicant: Genesis Photonics Inc., Tainan (TW)

(72) Inventors: Chin-Hua Hung, Tainan (TW);
Hao-Chung Lee, Tainan (TW);
Yu-Feng Lin, Tainan (TW)

(73) Assignee: GENESIS PHOTONICS INC., Tainan (TW)

( * ) Notice: Subject to any disclaimer, the term of this patent is extended or adjusted under 35 U.S.C. 154(b) by 53 days.

(21) Appl. No.: 14/690,480

(22) Filed: Apr. 20, 2015

(65) Prior Publication Data

US 2015/0318453 A1 Nov. 5, 2015

(30) Foreign Application Priority Data

Apr. 30, 2014 (TW) .............................. 103115611 A

(51) Int. Cl.
*H01L 33/50* (2010.01)
*H01L 33/52* (2010.01)

(52) U.S. Cl.
CPC .......... *H01L 33/508* (2013.01); *H01L 33/504* (2013.01); *H01L 33/52* (2013.01); *H01L 2933/005* (2013.01); *H01L 2933/0041* (2013.01)

(58) Field of Classification Search
None
See application file for complete search history.

(56) References Cited

U.S. PATENT DOCUMENTS

| 8,659,043 B1* | 2/2014 | Tischler | H01L 33/32 257/98 |
| 2009/0014741 A1* | 1/2009 | Masuda | C04B 35/22 257/98 |
| 2010/0181582 A1* | 7/2010 | Li | H01L 33/44 257/91 |
| 2012/0161180 A1 | 6/2012 | Komatsu | |

FOREIGN PATENT DOCUMENTS

| TW | 200537716 | 11/2005 |
| TW | 200611433 | 4/2006 |
| TW | 201112454 | 4/2011 |
| TW | 201228040 | 7/2012 |
| TW | 201311757 | 3/2013 |
| TW | M475702 | 4/2014 |

\* cited by examiner

*Primary Examiner* — Angel Roman
*Assistant Examiner* — Kevin Quinto
(74) *Attorney, Agent, or Firm* — CKC & Partners Co., Ltd.

(57) ABSTRACT

A package method includes steps of providing a light emitting module, a mold and a molding compound, wherein the light emitting module includes a substrate and at least one light emitting unit disposed on the substrate, the mold has at least one recess, and a side wall of the recess is parallel to a side surface of the light emitting unit; filling the recess with the molding compound; placing the substrate on the mold reversely, so that the light emitting unit is immersed into the recess and the molding compound directly encapsulates the light emitting unit; and heating and pressing the substrate and the mold, so as to solidify the molding compound.

9 Claims, 9 Drawing Sheets

PACKAGE METHOD AND PACKAGE

BACKGROUND OF THE INVENTION

1. Field of the Invention

The disclosure relates to a package method and a package and, more particularly, to a package method and a package capable of improving light uniformity and reducing the quantity of phosphor particles used in the package.

2. Description of the Prior Art

Referring to FIG. 1, FIG. 1 is a schematic view illustrating a package 1 of the prior art. As shown in FIG. 1, the package 1 comprises a package substrate 10, a light emitting diode 12 and a molding compound 14. The light emitting diode 12 is disposed on the package substrate 10 and the molding compound 14 is dispensed or sprayed on the package substrate 10 and the light emitting diode 12, so as to package the light emitting diode 12. In general, the molding compound contains a plurality of phosphor particles for converting a light color emitted by the light emitting diode 12 into desired light color. In the prior art, if the molding compound 14 is dispensed on the package substrate 10 and the light emitting diode 12, the phosphor particles may deposit on a light emitting surface of the light emitting diode 12 easily, such that the light color may be not uniform and the phosphor particles may be heated to induce heat exhaustion. Accordingly, the light conversion efficiency will be influenced. If the molding compound 14 is sprayed on the package substrate 10 and the light emitting diode 12, it needs to use a shielding plate and the phosphor particles may be wasted, such that the manufacture cost will increase. Furthermore, the spray process may result in a very wide distribution of light emitting angle and color temperature.

SUMMARY OF THE INVENTION

The disclosure provides a package method and a package capable of improving light uniformity and reducing the quantity of phosphor particles used in the package, so as to solve the aforementioned problems.

The package method of the disclosure comprises steps of providing a light emitting module, a mold and a molding compound, wherein the light emitting module comprises a substrate and at least one light emitting unit disposed on the substrate, the mold has at least one recess, and a side wall of the recess is parallel to a side surface of the light emitting unit; filling the recess with the molding compound; placing the substrate on the mold reversely, so that the light emitting unit is immersed into the recess and the molding compound directly encapsulates the light emitting unit; and heating and pressing the substrate and the mold, so as to solidify the molding compound.

The package of the disclosure comprises a substrate, a light emitting unit and a molding compound. The light emitting unit is disposed on the substrate and has a main light emitting surface. The molding compound is disposed on the substrate and directly encapsulates the light emitting unit. The molding compound comprises a plurality of first phosphor particles and a plurality of second phosphor particles, wherein an emission wavelength of the first phosphor particles is smaller than an emission wavelength of the second phosphor particles. The first phosphor particles in the molding compound have a first concentration per unit volume, and the second phosphor particles in the molding compound have a second concentration per unit volume, wherein the first concentration per unit volume is larger than the second concentration per unit volume at a position away from the main light emitting surface, and the first concentration per unit volume is smaller than the second concentration per unit volume at a position close to the main light emitting surface.

As the above mentioned, to manufacture the package of the disclosure, the disclosure fills the recess of the mold with the molding compound first and then places the substrate of the light emitting module on the mold reversely, so that the light emitting unit is immersed into the recess and the molding compound directly encapsulates the light emitting unit. Afterward, the disclosure heats and presses the substrate and the mold, so as to solidify the molding compound and finish the package. Then, the mold is removed from the light emitting module and the light emitting module is cut, so as to obtain a plurality of packages of the disclosure. The disclosure may dope at least two types of phosphor particles in the molding compound. When heating and pressing the substrate and the mold, the phosphor particles with shorter emission wavelength will deposit faster than the phosphor particles with longer emission wavelength. Accordingly, after finishing the package, the concentration per unit volume of the phosphor particles with shorter emission wavelength is larger than the concentration per unit volume of the phosphor particles with longer emission wavelength at a position away from the main light emitting surface of the light emitting unit, and the concentration per unit volume of the phosphor particles with shorter emission wavelength is smaller than the concentration per unit volume of the phosphor particles with longer emission wavelength at a position close to the main light emitting surface of the light emitting unit. Consequently, most of the light excited by the phosphor particles with shorter emission wavelength will not be absorbed by the phosphor particles with longer emission wavelength, such that the package can generate good light emitting effect and enhance color saturation of the light emitting device. Since the disclosure dopes at least two types of phosphor particles in the molding compound and the deposition rates of different phosphor particles are different from each other, different phosphor particles will be delaminated in the molding compound without additional process. Accordingly, the disclosure can save manufacture time effectively and needs not to use a shielding plate to form the molding compound, such that the quantity of phosphor particles in the molding compound can be reduced.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
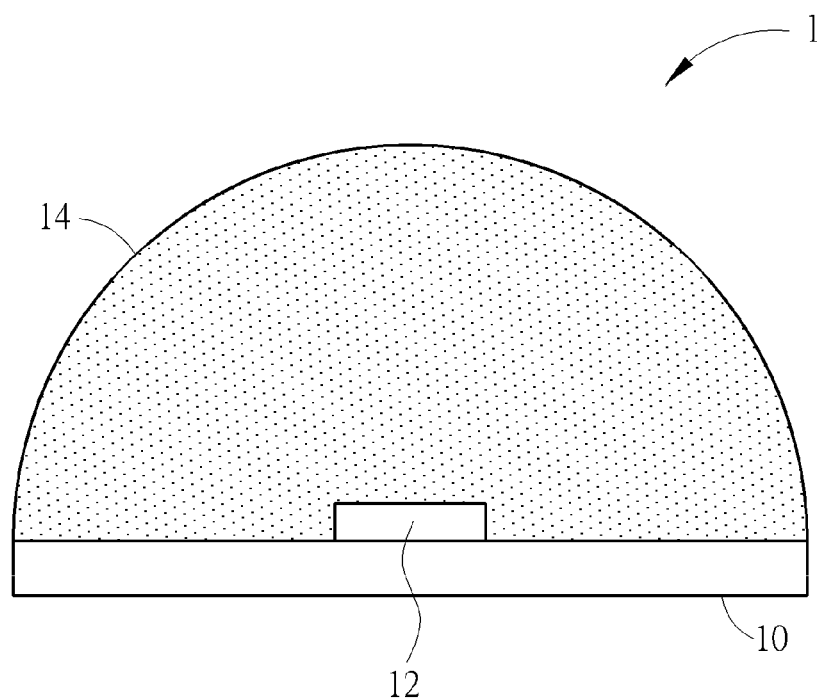
FIG. 1 is a schematic view illustrating a package of the prior art.
Figure 2:
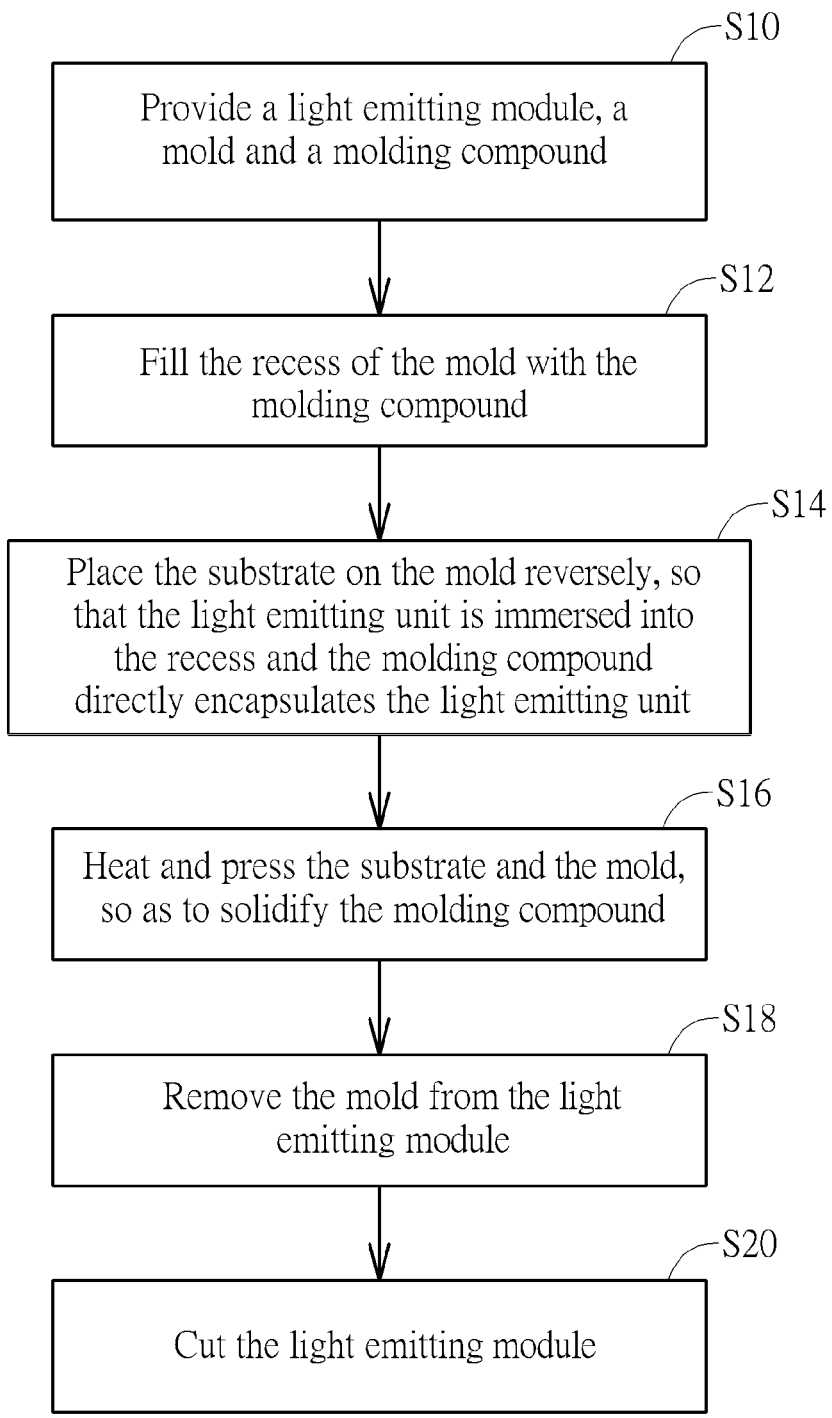
FIG. 2 is a flowchart illustrating a package method according to an embodiment of the disclosure.
Figure 3:
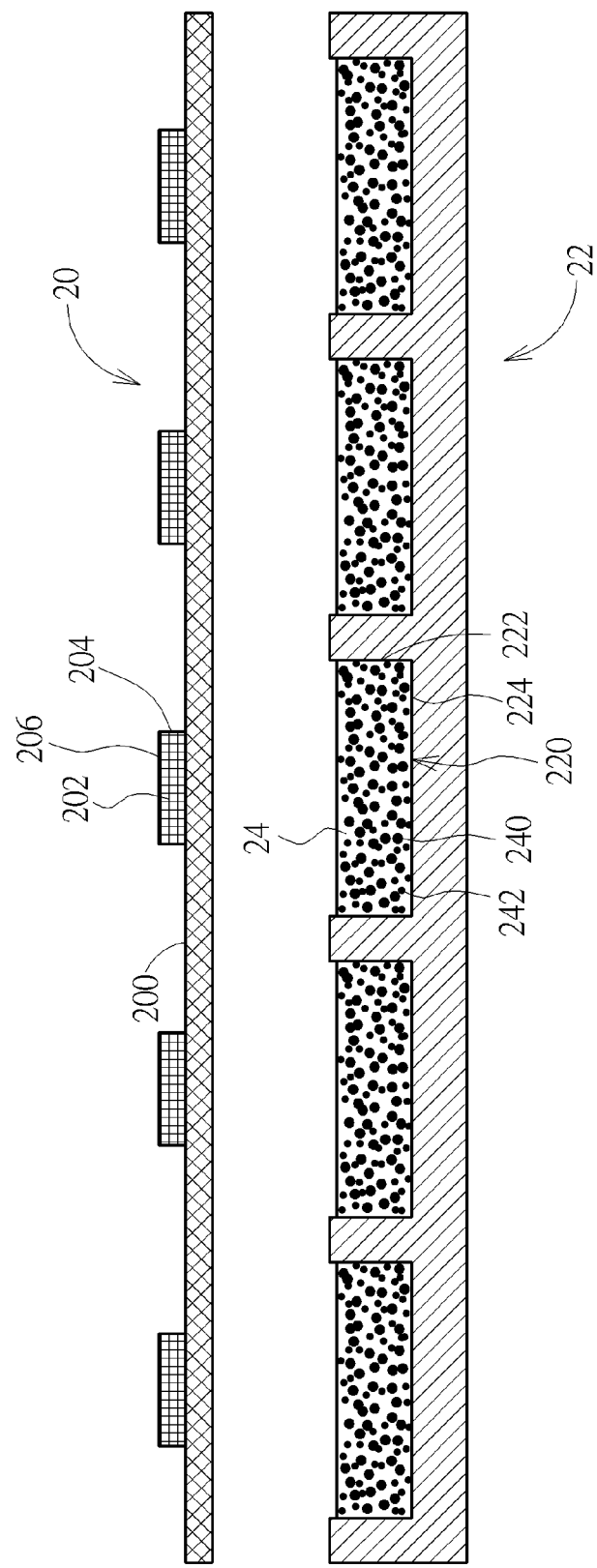
FIGS. 3 to 5 are schematic views illustrating processes associated with the package method shown in FIG. 2.
Figure 4:
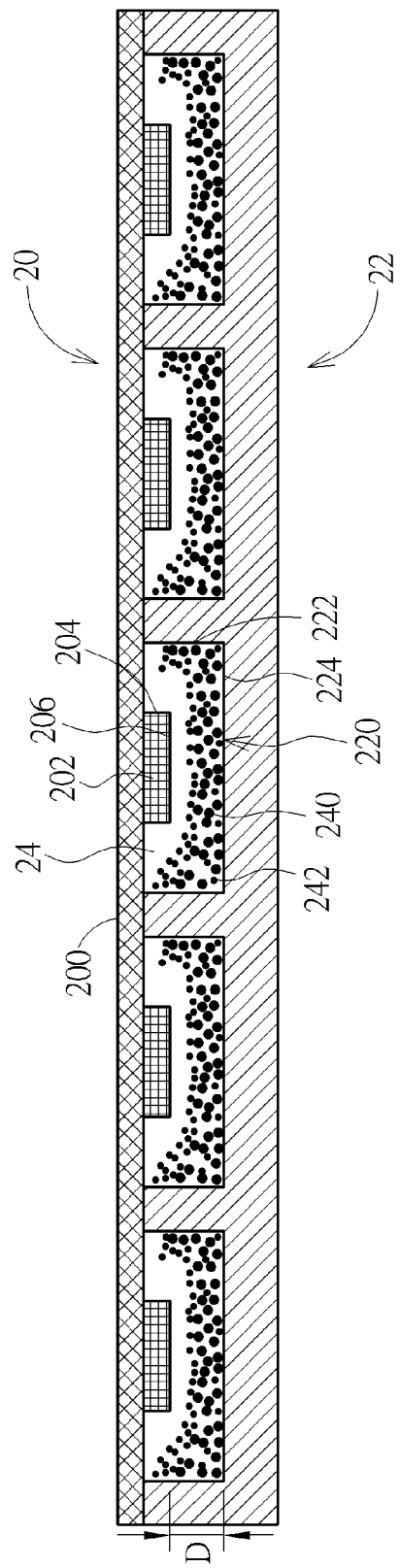
Figure 5:
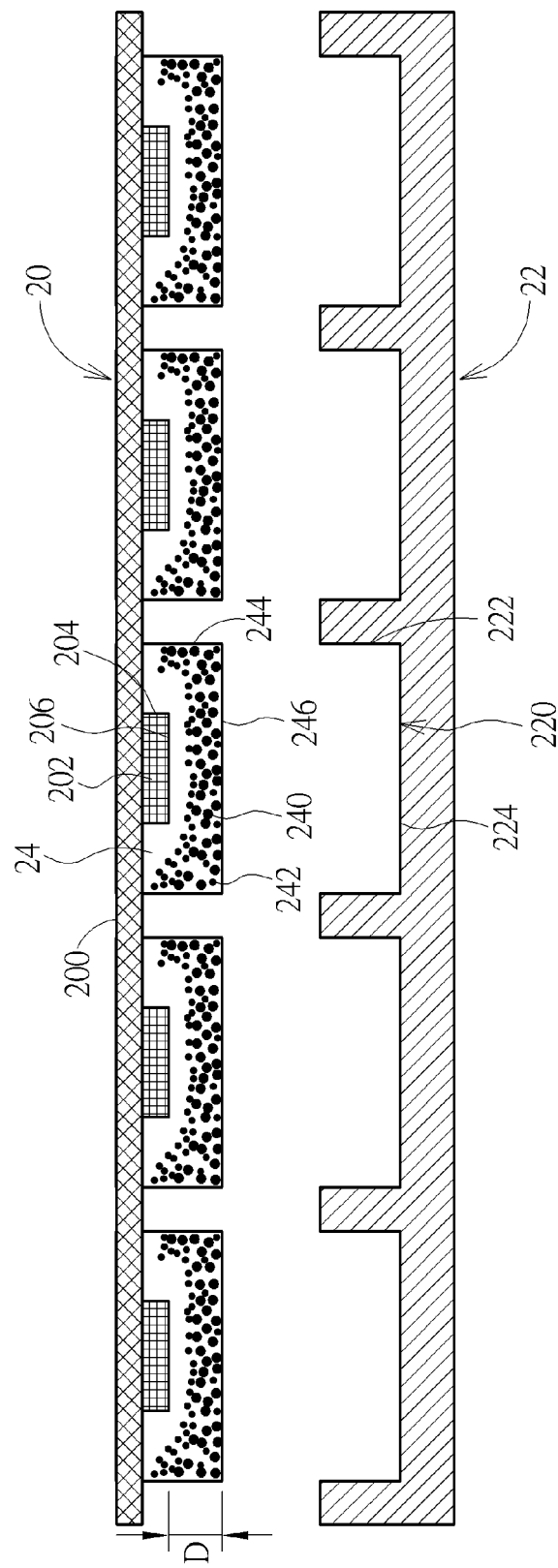
Figure 6:
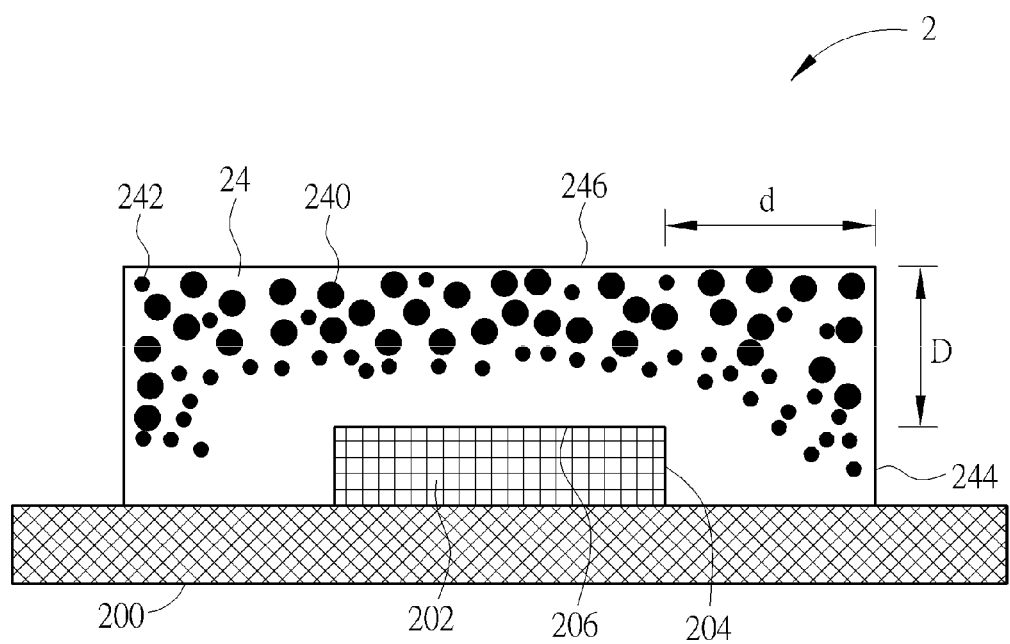
FIG. 6 is a schematic view illustrating a package according to an embodiment of the disclosure.

Referring to FIGS. 2 to 6, FIG. 2 is a flowchart illustrating a package method according to an embodiment of the disclosure, FIGS. 3 to 5 are schematic views illustrating processes associated with the package method shown in FIG. 2, and FIG. 6 is a schematic view illustrating a package 2 according to an embodiment of the disclosure. The package method shown in FIG. 2 is used for manufacturing the package 2 shown in FIG. 6.

First of all, step S10 in FIG. 2 is performed to provide a light emitting module 20, a mold 22 and a molding compound 24, wherein the light emitting module 20 comprises a substrate 200 and at least one light emitting unit 202 disposed on the substrate 200, the mold 22 has at least one recess 220, and a side wall 222 of the recess 220 is parallel to a first side surface 204 of the light emitting unit 202, as shown in FIG. 3. Afterward, step S12 in FIG. 2 is performed to fill the recess 220 of the mold 22 with the molding compound 24, as shown in FIG. 3. In this embodiment, the molding compound 24 may comprise a plurality of first phosphor particles 240 and a plurality of second phosphor particles 242, wherein an emission wavelength of the first phosphor particles 240 is smaller than an emission wavelength of the second phosphor particles 242, and the emission wavelengths of the first phosphor particles 240 and the second phosphor particles 242 are larger than the light wavelength emitted by the light emitting unit 202. For example, when the light emitting unit 202 is a blue light emitting diode, the first phosphor particles 240 may be green phosphor particles with the emission wavelength between 490 nm and 570 nm, and the second phosphor particles 242 may be red phosphor particles with the emission wavelength between 620 nm and 750 nm, so as to generate white light. However, the disclosure is not limited to the aforementioned embodiment. Furthermore, the substrate 200 may be, but not limited to, a ceramic substrate or other substrates, the light emitting unit 202 may be, but not limited to, a flip-chip light emitting diode, and the molding compound 24 may be, but not limited to, silicone or other transparent gel containing phosphor particles.

Then, step S14 in FIG. 2 is performed to place the substrate 200 on the mold 22 reversely, so that the light emitting unit 202 is immersed into the recess 220 and the molding compound 24 directly encapsulates the light emitting unit 202, as shown in FIG. 4. In this embodiment, a number of the recesses 220 are identical to a number of the light emitting units 202. Accordingly, after placing the substrate 200 on the mold 22 reversely, each of the light emitting units 202 is immersed into one of the recesses 220, respectively, and encapsulated by the molding compound 24, wherein the molding compound 24 contacts the light emitting unit 202 directly. The light emitting unit 202 has a main light emitting surface 206. After the light emitting unit 202 enters the corresponding recess 220, a vertical distance D between the main light emitting surface 206 of the light emitting unit 202 and a bottom 224 of the recess 220 is between 90 μm and 200 μm. Still further, a shape of the recess 220 is identical to a shape of the light emitting unit 202, e.g. rectangular. However, the shape of the recess 220 may be different from the shape of the light emitting unit 202, e.g. the bottom 224 of the recess 220 may be arc-shaped (not shown) and the light emitting unit 202 may be rectangular.

Then, step S16 in FIG. 2 is performed to heat and press the substrate 200 and the mold 22, so as to solidify the molding compound 24, as shown in FIG. 4. In this embodiment, a temperature for heating and pressing the substrate 200 and the mold 22 may be between 100° C. and 150° C. For example, the substrate 200 and the mold 22 may be heated and pressed with 120° C. and 10 minutes, so as to solidify the molding compound 24. After heating and pressing the substrate 200 and the mold 22, the first phosphor particles 240 in the molding compound 24 has a first concentration per unit volume and the second phosphor particles 242 in the molding compound 24 has a second concentration per unit volume.

When heating and pressing the substrate 200 and the mold 22, the first phosphor particles 240 with shorter emission wavelength will deposit faster than the second phosphor particles 242 with longer emission wavelength. Accordingly, after finishing the package, the first concentration per unit volume of the first phosphor particles 240 is larger than the second concentration per unit volume of the second phosphor particles 242 at a position away from the main light emitting surface 206 of the light emitting unit 202, and the first concentration per unit volume of the first phosphor particles 240 is smaller than the second concentration per unit volume of the second phosphor particles 242 at a position close to the main light emitting surface 206 of the light emitting unit 202. It should be noted that the disclosure can determine the temperature and time for the heating and pressing process according to the desired concentration distribution requirement and the disclosure is not limited to the aforementioned embodiment.

Then, step S18 in FIG. 2 is performed to remove the mold 22 from the light emitting module 20, as shown in FIG. 5. In this embodiment, the recess 220 of the mold may be polished in advance, such that the mold 22 can be removed more easily. Then, step S20 in FIG. 2 is performed to cut the light emitting module 20, so as to obtain a plurality of packages 2 shown in FIG. 6.

As shown in FIG. 4, after placing the substrate 200 on the mold reversely to make the light emitting unit 202 enter the corresponding recess 220, a side wall 222 of the recess 220 is parallel to a first side surface 204 of the light emitting unit 202. Accordingly, as shown in FIG. 6, after finishing the package 2, the first side surface 204 of the light emitting unit 202 is parallel to a second side surface 244 of the molding compound 24. Furthermore, as shown in FIGS. 4 and 6, the vertical distance D between the main light emitting surface 206 of the light emitting unit 202 and the bottom 224 of the recess 220 is equal to the vertical distance D between the main light emitting surface 206 of the light emitting unit 202 and the upper surface 246 of the molding compound 24. Therefore, the vertical distance D between the main light emitting surface 206 of the light emitting unit 202 and the upper surface 246 of the molding compound 24 is also between 90 μm and 200 μm. Accordingly, the molding compound 24 can be thinned and the package 2 can generate good light emitting effect. Moreover, since the shape of the recess 220 is identical to the shape of the light emitting unit 202, the shape of the molding compound 24 is also identical to the shape of the light emitting unit 202. Accordingly, the shape of the molding compound 24 and the light shape emitted by the light emitting unit 202 can match pretty well, so as to enhance light uniformity of the package 2.

After finishing the package 2, since the first concentration per unit volume of the first phosphor particles 240 is larger than the second concentration per unit volume of the second phosphor particles 242 at a position away from the main light emitting surface 206 of the light emitting unit 202, and the first concentration per unit volume of the first phosphor particles 240 is smaller than the second concentration per unit volume of the second phosphor particles 242 at a position close to the main light emitting surface 206 of the light emitting unit 202, most of the light excited by the first phosphor particles 240 with shorter emission wavelength will not be absorbed by the second phosphor particles 242, such that the package 2 can generate color saturation. Furthermore, since the disclosure dopes at least two types of phosphor particles (e.g. first phosphor particles 240 and the second phosphor particles 242) in the molding compound 24 and the deposition rates of different phosphor particles are different from each other, different phosphor particles will be delaminated in the molding compound 24 without additional process. Accordingly, the disclosure can save manufacture time and reduce the quantity of phosphor particles in the molding compound 24 effectively. Still further, as shown in FIG. 4, when heating and pressing the substrate 200 and the mold 22, the first phosphor particles 240 and the second phosphor particles 242 will deposit downward to be away from the light emitting unit 202, such that the disclosure can prevent the first phosphor particles 240 and the second phosphor particles 242 from being heated to induce heat exhaustion. Moreover, if the light emitting unit 202 can emit light laterally, the recess 202 of the mold 22 may be designed appropriately, such that the vertical distance D between the main light emitting surface 206 of the light emitting unit 202 and the upper surface 246 of the molding compound 24 is smaller than the vertical distance d between the first side surface 204 of the light emitting unit 202 and the second side surface 244 of the molding compound 24, so as to enhance lateral light emitting effect and enlarge light emitting angle.

Figure 7:
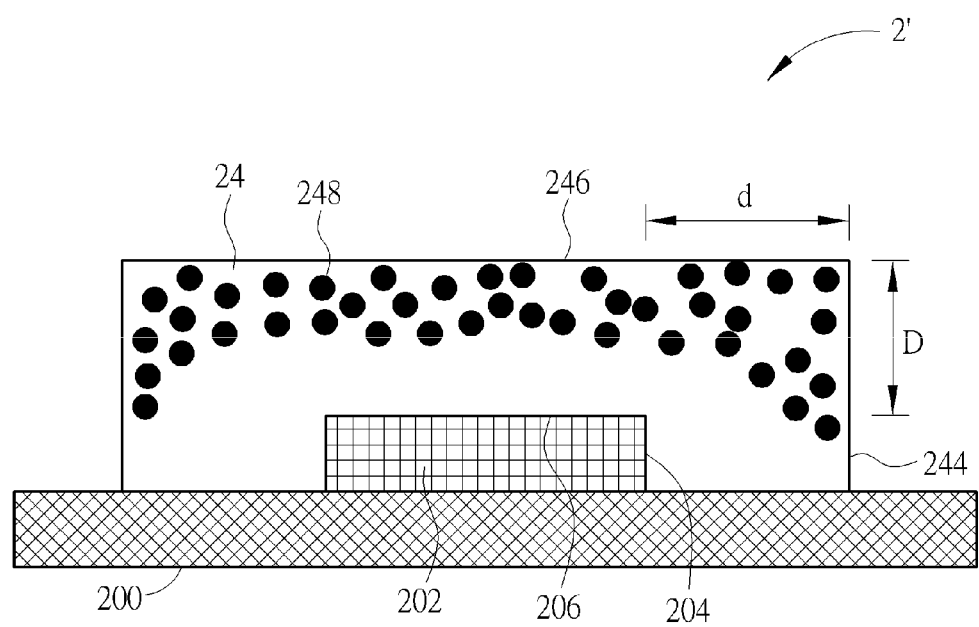
FIG. 7 is a schematic view illustrating a package according to another embodiment of the disclosure.

Referring to FIG. 7 along with FIG. 6, FIG. 7 is a schematic view illustrating a package 2' according to another embodiment of the disclosure. The main difference between the package 2' and the aforementioned package 2 is that the molding compound 24 of the package 2' only comprises one type of phosphor particles 248, wherein a concentration per unit volume of the phosphor particles 248 increases gradually in a direction away from the main light emitting surface 206 of the light emitting unit 202, as shown in FIG. 7. In other words, the disclosure may selectively dope at least one type of phosphor particles in the molding compound 24 according to practical applications. It should be noted that the same elements in FIG. 7 and FIG. 6 are represented by the same numerals, so the repeated explanation will not be depicted herein again.

Figure 8:
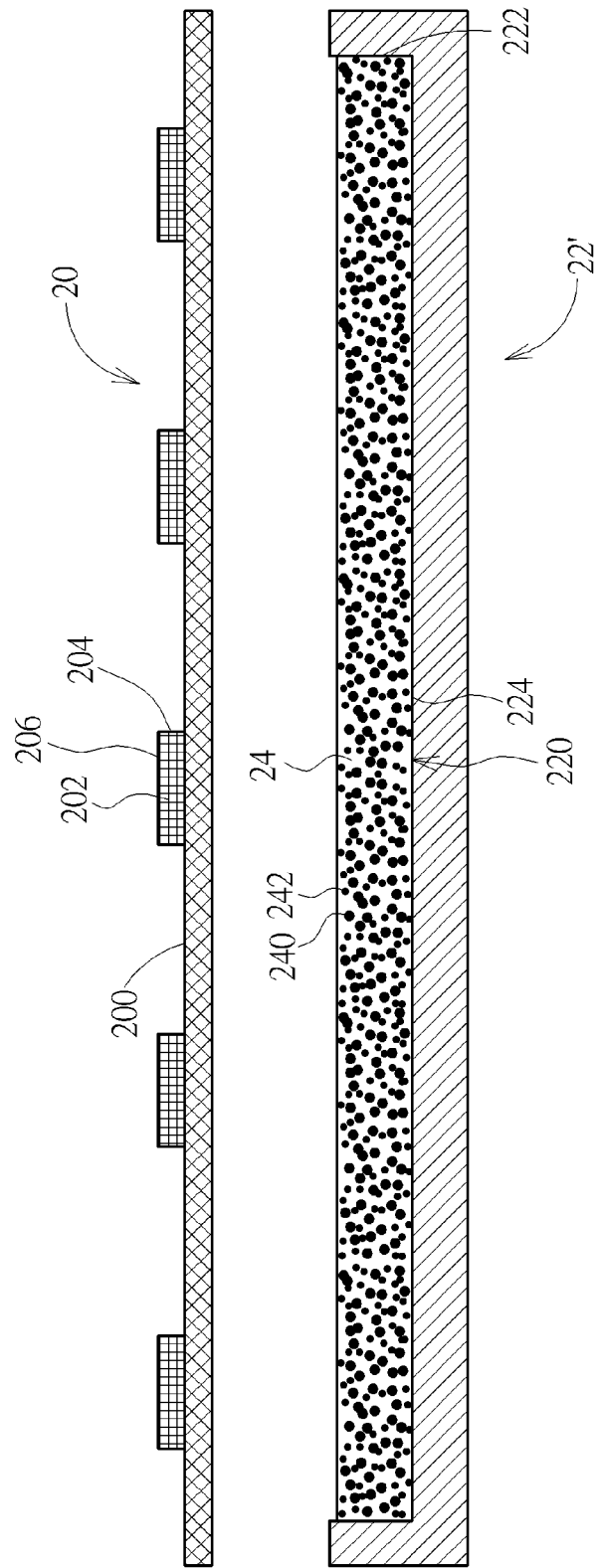
FIG. 8 is a schematic view illustrating a light emitting module and a mold according to another embodiment of the disclosure.
Figure 9:
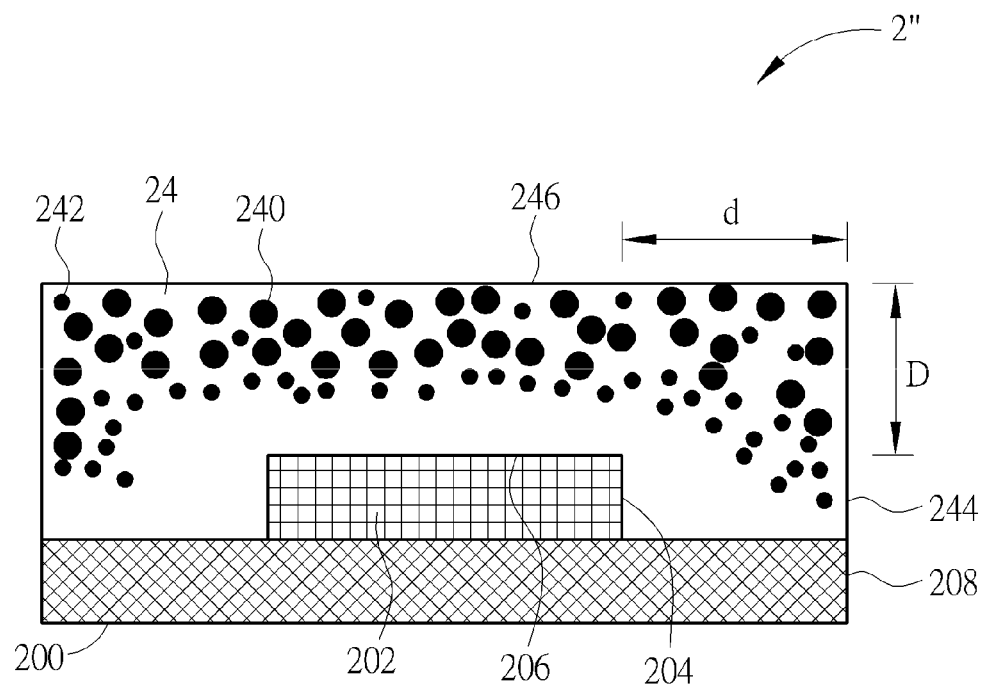
FIG. 9 is a schematic view illustrating a package according to another embodiment of the disclosure.

Referring to FIGS. 8 and 9 along with FIGS. 3 to 6, FIG. 8 is a schematic view illustrating a light emitting module 20 and a mold 22' according to another embodiment of the disclosure, and FIG. 9 is a schematic view illustrating a package 2' according to another embodiment of the disclosure. The package method shown in FIG. 2 can use the mold 22' shown in FIG. 8 to manufacture the package 2' shown in FIG. 9. The main difference between the mold 22' and the aforementioned mold 22 is that the mold 22' only has one single recess 220, as shown in FIG. 8. In other words, the disclosure may use the single recess 220 of the mold 22' to package a plurality of light emitting units 202 at the same time. As shown in FIG. 9, after finishing the package 2" by the package method shown in FIG. 2 using the mold 22' shown in FIG. 8, the second side surface 244 of the molding compound 24 and the third side surface 208 of the substrate 200 are coplanar. In this embodiment, the disclosure can increase the number of packages per unit volume. It should be noted that the same elements in FIGS. 8-9 and FIGS. 3-6 are represented by the same numerals, so the repeated explanation will not be depicted herein again.

As the above mentioned, to manufacture the package of the disclosure, the disclosure fills the recess of the mold with the molding compound first and then places the substrate of the light emitting module on the mold reversely, so that the light emitting unit is immersed into the recess and the molding compound directly encapsulates the light emitting unit. Afterward, the disclosure heats and presses the substrate and the mold, so as to solidify the molding compound and finish the package. Then, the mold is removed from the light emitting module and the light emitting module is cut, so as to obtain a plurality of packages of the disclosure. The disclosure may dope at least two types of phosphor particles in the molding compound. When heating and pressing the substrate and the mold, the phosphor particles with shorter emission wavelength will deposit faster than the phosphor particles with longer emission wavelength. Accordingly, after finishing the package, the concentration per unit volume of the phosphor particles with shorter emission wavelength is larger than the concentration per unit volume of the phosphor particles with longer emission wavelength at a position away from the main light emitting surface of the light emitting unit, and the concentration per unit volume of the phosphor particles with shorter emission wavelength is smaller than the concentration per unit volume of the phosphor particles with longer emission wavelength at a position close to the main light emitting surface of the light emitting unit. Consequently, most of the light excited by the phosphor particles with shorter emission wavelength will not be absorbed by the phosphor particles with longer emission wavelength, such that the package can generate good light emitting effect and enhance color saturation of the light emitting device. Since the disclosure dopes at least two types of phosphor particles in the molding compound and the deposition rates of different phosphor particles are different from each other, different phosphor particles will be delaminated in the molding compound without additional process. Accordingly, the disclosure can save manufacture time effectively and needs not to use a shielding plate to form the molding compound, such that the quantity of phosphor particles in the molding compound can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package method comprising:
   providing a light emitting module having a substrate and at least one light emitting unit disposed on the substrate, wherein the light emitting unit having a main light emitting surface;
   providing a mold having at least one recess and maintaining the recess face upward;
   filling the recess with a molding compound having phosphor particles comprising a plurality of first phosphor particles and a plurality of second phosphor particles, an emission wavelength of the first phosphor particles is smaller than an emission wavelength of the second phosphor particles, the first phosphor particles in the molding compound having a first concentration per unit volume, the second phosphor particles in the molding compound having a second concentration per unit volume;

placing the substrate on the mold reversely, so that the light emitting unit is faced downward and immersed into the recess and the molding compound directly encapsulates the light emitting unit;

heating and pressing the substrate and the mold, so as to enable the phosphor particles to deposit at positions closer to an inner surface of the recess and solidify the molding compound; and removing the mold to uncover the solidified molding compound to achieve that a concentration per unit volume of the phosphor particles is greater at a closer position to an outer surface of the solidified molding compound than at a farther position away from the outer surface of the solidified molding compound, wherein the first concentration per unit volume is larger than the second concentration per unit volume at a first position away from the main light emitting surface, the first concentration per unit volume is smaller than the second concentration per unit volume at a second position that is closer to the main light emitting surface than the first position after heating and pressing the substrate and the mold.

2. The package method of claim 1, wherein a temperature for heating and pressing the substrate and the mold is between 100° C. and 150° C.

3. The package method of claim 1, wherein the light emitting unit is a blue light emitting diode, the emission wavelength of the first phosphor particles is between 490 nm and 570 nm, and the emission wavelength of the second phosphor particles is between 620 nm and 750 nm.

4. The package method of claim 1, wherein a vertical distance between the main light emitting surface and a bottom of the recess is between 90 µm and 200 µm.

5. The package method of claim 1, wherein a shape of the recess is identical to a shape of the light emitting unit.

6. The package method of claim 1, wherein a number of the recesses are identical to a number of the light emitting units.

7. A package method comprising:

providing a light emitting module having a substrate and at least one light emitting unit coupled to the substrate, wherein the light emitting unit having a main light emitting surface;

providing a mold having at least one recess facing upwardly;

filling the recess with a molding compound having phosphor particles comprising a plurality of first phosphor particles and a plurality of second phosphor particles, an emission wavelength of the first phosphor particles is smaller than an emission wavelength of the second phosphor particles, the first phosphor particles in the molding compound having a first concentration per unit volume, the second phosphor particles in the molding compound having a second concentration per unit volume;

placing the substrate on the mold reversely and having the molding compound encapsulate the light emitting unit and a portion of the substrate;

having the phosphor particles gradually precipitate toward a bottom of the recess;

curing the molding compound with the phosphor particles precipitated close to the bottom of the recess; and removing the mold to uncover the cured molding compound, wherein a concentration of the phosphor particles in the cured molding compound increases gradually in a direction away from the light emitting unit, wherein the first concentration per unit volume is larger than the second concentration per unit volume at a first position away from the main light emitting surface, and the first concentration per unit volume is smaller than the second concentration per unit volume at a second position that is closer to the main light emitting surface than the first position after curing the molding compound.

8. The package method of claim 7, wherein the molding compound is cured by heating and pressing and a temperature for heating is between 100° C. and 150° C.

9. The package method of claim 7, wherein the light emitting unit is a blue light emitting diode, the emission wavelength of the first phosphor particles is between 490 nm and 570 nm, and the emission wavelength of the second phosphor particles is between 620 nm and 750 nm.

* * * * *